United States Patent
Chen et al.

(10) Patent No.: US 11,127,808 B2
(45) Date of Patent: Sep. 21, 2021

(54) ACTIVE DEVICE SUBSTRATE AND MANUFACTURING METHOD THEREOF

(71) Applicant: Au Optronics Corporation, Hsinchu (TW)

(72) Inventors: Ming-Yao Chen, Hsinchu (TW); Kuo-Yu Huang, Hsinchu County (TW); Wen-Yi Hsu, Taoyuan (TW)

(73) Assignee: Au Optronics Corporation, Hsinchu (TW)

( * ) Notice: Subject to any disclaimer, the term of this patent is extended or adjusted under 35 U.S.C. 154(b) by 30 days.

(21) Appl. No.: 16/543,626

(22) Filed: Aug. 19, 2019

(65) Prior Publication Data
US 2020/0105857 A1    Apr. 2, 2020

(30) Foreign Application Priority Data
Oct. 1, 2018   (TW) .................................. 107134629

(51) Int. Cl.
*H01L 27/32*    (2006.01)
*H01L 27/12*    (2006.01)

(52) U.S. Cl.
CPC ...... *H01L 27/3276* (2013.01); *H01L 27/1244* (2013.01); *H01L 27/1259* (2013.01); *H01L 27/3248* (2013.01)

(58) Field of Classification Search
CPC ............. H01L 27/3276; H01L 27/1244; H01L 27/1259; H01L 27/3248
See application file for complete search history.

(56) References Cited

U.S. PATENT DOCUMENTS 9,954,194 B2    4/2018  Lee
10,090,336 B2   10/2018 Han
(Continued)

FOREIGN PATENT DOCUMENTS

CN     101369082    2/2009
CN     105870151    8/2016
(Continued)

OTHER PUBLICATIONS

Guo et al., CN101369082A, "English Translation", Feb. 18, 2009, AU Optronics Corp, pp. 1-7 (Year: 2009).*

*Primary Examiner* — Shaun M Campbell
(74) *Attorney, Agent, or Firm* — JCIPRNET

(57) ABSTRACT

An active device substrate and a manufacturing method thereof are provided. The active device substrate includes a substrate, first and second scan lines, a data line, first and second active devices and first and second pixel electrodes. The first active device includes a first semiconductor channel layer, a first gate, a first source and a first drain. The first gate is electrically connected to the first scan line. The first pixel electrode is electrically connected to the first drain. The second active device includes a second semiconductor channel layer, a second gate and a second drain. The first semiconductor channel layer is connected to a source region of the second semiconductor channel layer. The first semiconductor channel layer and the second semiconductor channel layer belong to same layer. The second gate is electrically connected to the second scan line. The second pixel electrode is electrically connected to the second drain.

19 Claims, 19 Drawing Sheets

(56) References Cited

U.S. PATENT DOCUMENTS

| | | | | |
|---|---|---|---|---|
| 2008/0017866 A1* | 1/2008 | Sato | ................. | H01L 29/78663 |
| | | | | 257/72 |
| 2012/0037908 A1* | 2/2012 | Wu | ................. | H01L 29/66742 |
| | | | | 257/59 |
| 2015/0102355 A1* | 4/2015 | Yang | ................. | H01L 27/1259 |
| | | | | 257/72 |
| 2016/0233285 A1* | 8/2016 | Lee | ................. | H01L 51/5228 |
| 2018/0040646 A1 | 2/2018 | Han | | |

FOREIGN PATENT DOCUMENTS

| | | |
|---|---|---|
| GN | 105679769 | 6/2016 |
| GN | 105762196 | 7/2016 |

\* cited by examiner

ACTIVE DEVICE SUBSTRATE AND MANUFACTURING METHOD THEREOF

CROSS-REFERENCE TO RELATED APPLICATION

This application claims the priority benefit of Taiwan application serial no. 107134629, filed on Oct. 1, 2018. The entirety of the above-mentioned patent application is hereby incorporated by reference herein and made a part of this specification.

BACKGROUND OF THE DISCLOSURE

Field of the Disclosure

The present invention is related to an active device substrate, and more particularly to an active device substrate including a first active device and a second active device, and a method of manufacturing the same.

Description of Related Art

In recent years, with the advancement of display technology, the improvement of display resolution, computer computing technology and network speed has led to the rapid development of augmented reality (AR) and virtual reality (VR) technologies. In the foreseeable future, augmented reality and virtual reality technologies will be widely applied in education, logistics, medical, military and manufacturing, especially with the aid of Industry 4.0.

The display panel required for augmented reality and virtual reality applications is mainly loaded in a head-mounted display. The user's immersion is enhanced when the screen resolution of the display panel is improved. Therefore, the improvement of display panel resolution technology is the key to accelerate the development of augmented reality and virtual reality applications.

SUMMARY

The present invention provides an active device substrate capable of improving insufficient screen resolution of a display panel.

The present invention provides a method of manufacturing an active device substrate, by which insufficient screen resolution of a display panel can be improved.

At least one embodiment of the present invention provides an active device substrate including a substrate, a first scan line, a second scan line, a data line, a first active device, a first pixel electrode, a second active device and a second pixel electrode. The first scan line, the second scan line and the data line are disposed on the substrate. The first active device includes a first semiconductor channel layer, a first gate, a first source and a first drain. The first gate is overlapped with the first semiconductor channel layer and electrically connected to the first scan line. The first source is electrically connected to the data line and the first semiconductor channel layer. The first drain is electrically connected to the first semiconductor channel layer. The first pixel electrode is electrically connected to the first drain. The second active device includes a second semiconductor channel layer, a second gate and a second drain. The first semiconductor channel layer is connected to a source region of the second semiconductor channel layer. The first semiconductor channel layer and the second semiconductor channel layer belong to the same layer. The second gate is overlapped with the second semiconductor channel layer and electrically connected to the second scan line. The second drain is electrically connected to the second semiconductor channel layer. The second pixel electrode is electrically connected to the second drain.

At least one embodiment of the present invention provides a method of manufacturing an active device substrate that includes the following steps. A substrate is provided. A semiconductor layer is formed on the substrate. A gate insulating layer is formed on the substrate. A treatment process is performed on the semiconductor layer to form a first semiconductor channel layer and a second semiconductor channel layer. The first semiconductor channel layer is connected to a source region of the second semiconductor channel layer. A first scan line, a second scan line, a first gate and a second gate are formed on the gate insulating layer. The first gate is electrically connected to the first scan line, and the second gate is electrically connected to the second scan line. An interlayer dielectric layer is formed on the first scan line, the second scan line, the first gate and the second gate. A first source, a data line, a first drain and a second drain are formed on the interlayer dielectric layer. The first source is electrically connected to the data line and the first semiconductor channel layer. The first drain and the second drain are electrically connected to the first semiconductor channel layer and the second semiconductor channel layer, respectively. A first insulating layer is formed on the first source, the first drain, the second drain, the data line and the interlayer dielectric layer. A first pixel electrode and a second pixel electrode are formed on the first insulating layer. The first pixel electrode and the second pixel electrode are electrically connected to the first drain and the second drain, respectively.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

FIG. 1A to FIG. 1F are schematic top views of a method of manufacturing an active device substrate in accordance with an embodiment of the present invention. FIG. 2 is a schematic cross-sectional view of an active device substrate in accordance with an embodiment of the present invention. FIG. 2 corresponds to a cross-sectional view taken along the line AA' of FIG. 1F.

Figure 1A:
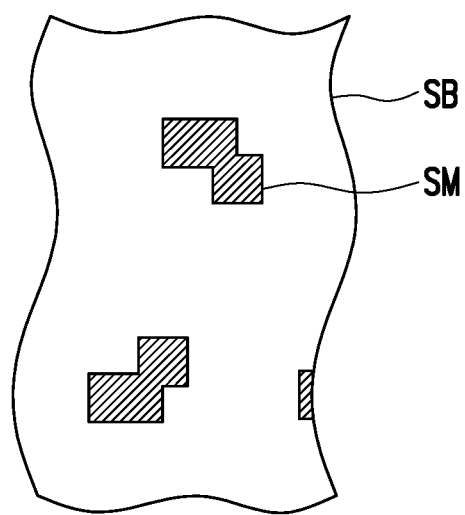
FIG. 1A to FIG. 1F are schematic top views of a method of manufacturing an active device substrate in accordance with an embodiment of the present invention.
Figure 2:
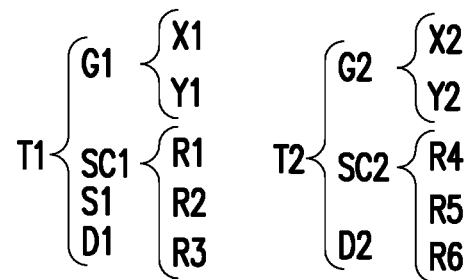
FIG. 2 is a schematic cross-sectional view of an active device substrate in accordance with an embodiment of the present invention.
Figure 2:
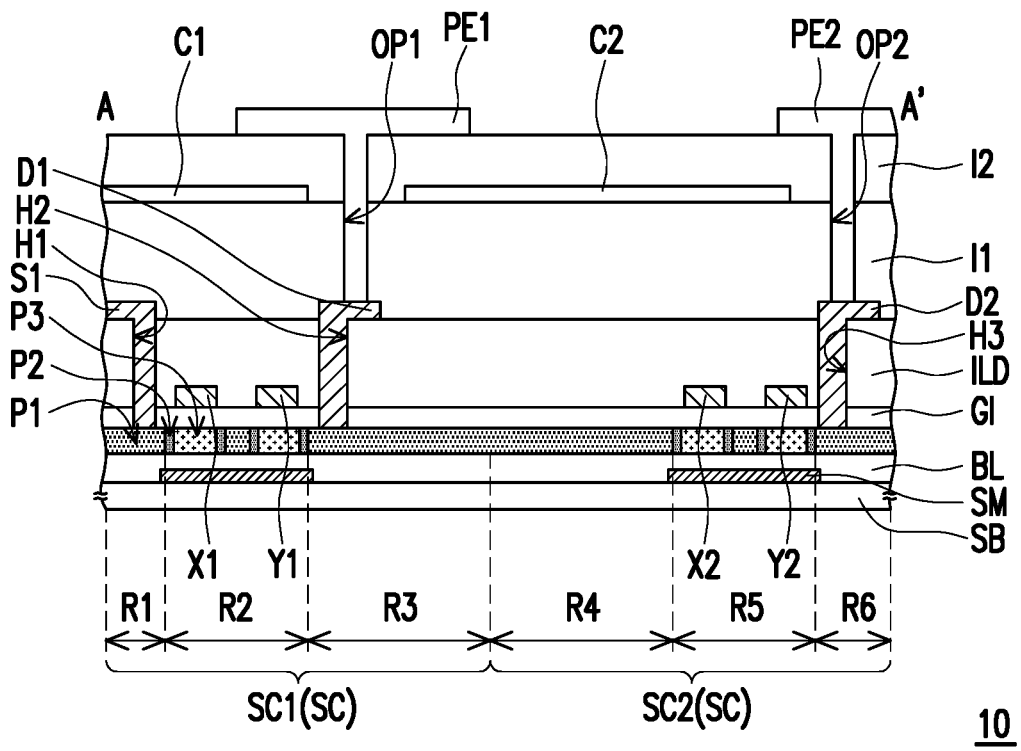

Referring to FIG. 1A and FIG. 2, a substance SB is provided. The material of the substrate SB can be glass, quartz, an organic polymer, or an opaque/reflective material (e.g., a conductive material, metal, wafer, ceramics or the like), or another suitable material. If a conductive material or metal is used, an insulating layer (not shown) is overlaid on the substrate SB to prevent a short circuit from occurring. In some embodiments, a light shielding layer SM is optionally formed on the substrate SB. The light shielding layer SM is beneficial to improve the leakage issue of an active device substrate.

Figure 1B:
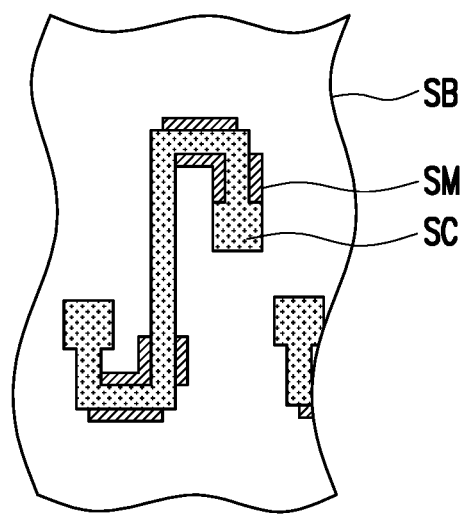

Referring to FIG. 1B and FIG. 2, a semiconductor layer SC is formed on the substrate SB. The semiconductor layer SC can be overlapped with the light shielding layer SM. In the present embodiment, a buffer layer BL is formed before the formation of the semiconductor layer SC. The buffer layer BL can be located between the semiconductor layer SC and the light shielding layer SM, but the invention is not limited thereto. The material of the buffer layer BL includes an inorganic material (e.g., silicon oxide, silicon nitride, silicon oxynitride, another suitable material or a stacked layer of at least two of the above materials), an organic material, another suitable material or a combination thereof.

The semiconductor layer SC has a single-layer or multi-layer structure, and includes amorphous silicon, polycrystalline silicon, microcrystalline silicon, single-crystalline silicon, an organic semiconductor material, an oxide semiconductor material (e.g., indium zinc oxide, indium gallium zinc oxide, another suitable material or a combination thereof), another suitable material or a combination thereof, or contains a dopant in the above materials. In the present embodiment, the semiconductor layer SC includes polycrystalline silicon, for example.

Figure 1C:
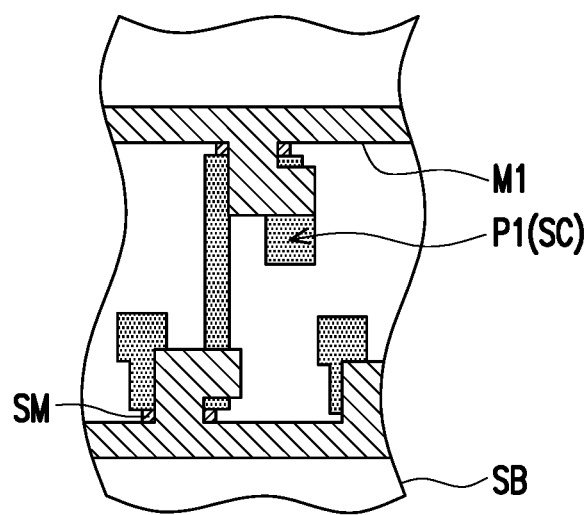
Figure 1D:
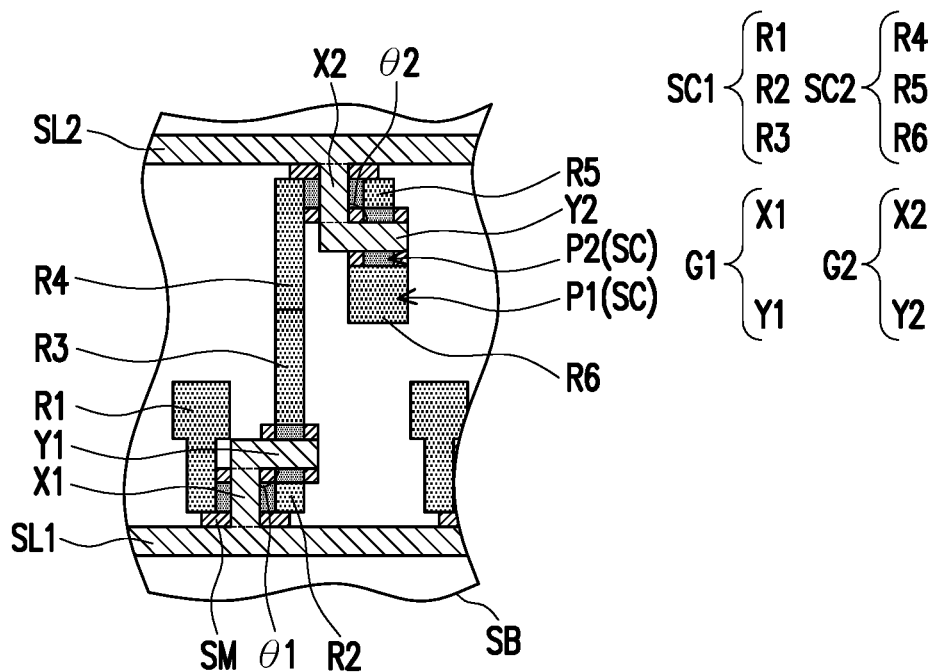

Referring to FIG. 1C, FIG. 1D and FIG. 2, a gate insulating layer GI is formed on the substrate SB.

A first metal layer M1 is formed on the gate insulating layer GI. The first metal layer M1 is overlapped with a portion of the semiconductor layer SC. A heavily doping process is performed on the semiconductor layer SC by using the first metal layer M1 as a mask, so as to form a heavily doped region P1 in the semiconductor layer SC.

The first metal layer M1 is patterned to form a first scan line SL1, a second scan line SL2, a first gate G1 and a second gate G2. The first scan line SL1, the second scan line SL2, the first gate G1 and the second gate G2 are located on the gate insulating layer GI. The first gate G1 is electrically connected to the first scan line SL1, and the second gate G2 is electrically connected to the second scan line SL2.

In some embodiments, a lightly doping process is optionally performed on the semiconductor layer SC. For example, a lightly doping process is performed on the semiconductor layer SC by using the first scan line SL1, the second scan line SL2, the first gate G1 and the second gate G2 as a mask, so as to form a lightly doped region P2 in the semiconductor layer SC.

A treatment process is performed on the semiconductor layer SC to form a first semiconductor channel layer SC1 and a second semiconductor channel layer SC2. In some embodiments, the first semiconductor channel layer SC1 and the second semiconductor channel layer SC2 are, for example, P-type doped semiconductor materials or N-type doped semiconductor materials. In the present embodiment, the treatment process is the heavily doping process of FIG. 1C, and the heavily doping process (FIG. 1C) and the lightly doping process (FIG. 1D) are performed on the semiconductor layer SC to form the first semiconductor channel layer SC1 and the second semiconductor channel layer SC2. However, the invention is not limited thereto. In another embodiment, the material of the semiconductor layer SC includes metal oxide, and the treatment process is a plasma treatment process.

The first semiconductor channel layer SC1 includes a source region R1, a channel region R2 and a drain region R3 connected in sequence. The second semiconductor channel layer SC2 includes a source region R4, a channel region R5 and a drain region R6 connected in sequence.

In the present embodiment, the channel region R2 and the channel region R5 have portions (i.e., the portions overlapped with the first gate G1 and the second gate G2) that are not subjected to the heavily doping process and the lightly doping process and belong to active regions P3, portions at two sides of the active regions P3 that belong to the lightly doped region P2, and portions at two sides of the lightly doped regions P2 that belong to the heavily doped region P1.

The first gate G1 includes a first extending part X1 and a first branch part Y1. The first extending part X1 is connected to the first scan line SL1. The first branch part Y1 is connected to the first extending part X1, and has an included angle θ1 with the first extending part X1. The included angle θ1 is, for example, less than 180 degrees and greater than 0 degrees. In this embodiment, the included angle is about 90 degrees. The first extending part X1 and the first branch part Y1 are respectively overlapped with the first semiconductor channel layer SC1. Therefore, the channel region R2 has two separate active regions P3 which are respectively overlapped with the first extending part X1 and the first branch part Y1, thereby reducing the leakage current.

The second gate G2 includes a second extending part X2 and a second branch part Y2. The second extending part X2 is connected to the second scan line SL2. The second branch part Y2 is connected to the second extending part X2 and has an included angle θ2 with the second extending part X2. The second extending part X2 and the second branch part Y2 are respectively overlapped with the second semiconductor channel layer SC2. Therefore, the channel region R5 has two separate active regions P3 which are respectively overlapped with the second extending part X2 and the second branch part Y2, thereby reducing the leakage current.

The source region R1, the drain region R3, the source region R4 and the drain region R6 are subjected to the heavily doping process, so the source region R1, the drain region R3, the source region R4 and the drain region R6 belong to the heavily doped region P1. In some embodiments, the heavily doped region P1 has a dopant concentration of $10^{18}$-$10^{20}$ atoms/cm3. In some embodiments, the heavily doped region P1 has a sheet resistance of $\leq 10^4$ Ω/Square.

The drain region R3 of the first semiconductor channel layer SC1 is connected to the source region R4 of the second semiconductor channel layer SC2.

Figure 1E:
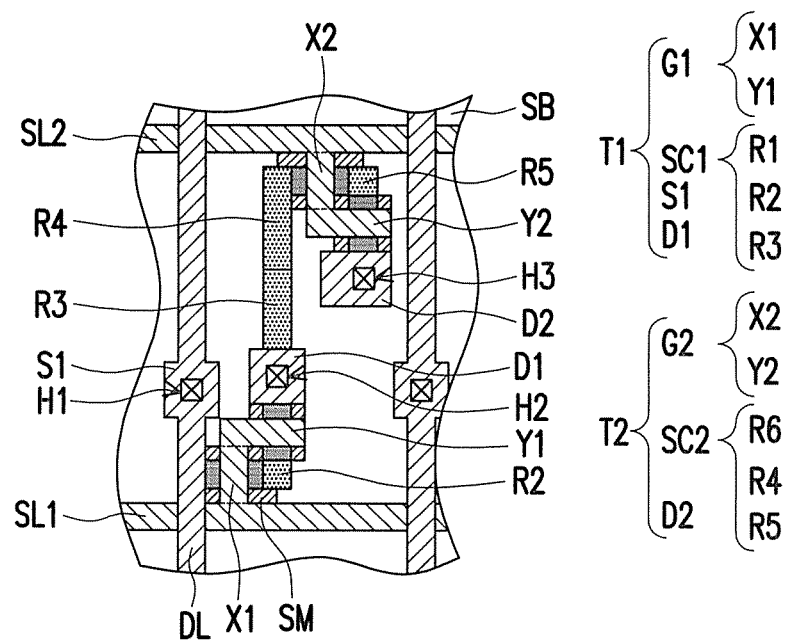

Referring to FIG. 1E and FIG. 2, an interlayer dielectric layer ILD is formed on the first scan line SL1, the second scan line SL2, the first gate G1 and the second gate G2.

The first source S1, the data line DL, the first drain D1 and the second drain D2 are formed on the interlayer dielectric layer ILD. The first source S1 is electrically connected to the data line DL and the first semiconductor channel layer SC1. The first drain D1 and the second drain D2 are electrically connected to the first semiconductor channel layer SC1 and the second semiconductor channel layer SC2, respectively. In the present embodiment, the interlayer dielectric layer ILD has openings H1, H2 and H3. The first dielectric S1 is electrically connected to the source region R1 of the first semiconductor channel layer SC1 through the opening H1. The first drain D1 and the second drain D2 are respectively electrically connected to the drain region R3 of the first semiconductor channel layer SC1 and the drain region R6 of the second semiconductor channel layer SC2 through the opening H2 and the opening H3.

At this point, a first active device T1 and a second active device T2 are substantially completed. The first active device T1 and the second active device T2 are located between the first scan line SL1 and the second scan line SL2. The first active device T1 includes a first semiconductor channel layer SC1, a first gate G1, a first source S1 and a first drain D1. The first gate G1 is overlapped with the first semiconductor channel layer SC1 and electrically connected to the first scan line SL1. The first source S1 is electrically connected to the data line DL and the first semiconductor channel layer SC1. The first drain D1 is electrically connected to the first semiconductor channel layer SC1. The second active device T2 includes a second semiconductor channel layer SC2, a second gate G2 and a second drain D2. The first semiconductor channel layer SC1 is connected to the source region R4 of the second semiconductor channel layer SC2. The first semiconductor channel layer SC1 and the second semiconductor channel layer SC2 belong to the same layer. The second gate G2 is overlapped with the second semiconductor channel layer SC2 and electrically connected to the second scan line SL2. The second drain D2 is electrically connected to the second semiconductor channel layer SC2.

Figure 1F:
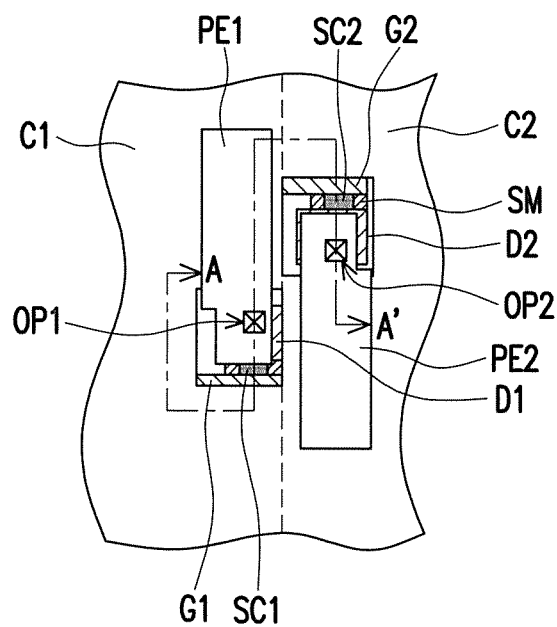

Referring to FIG. 1F and FIG. 2, a first insulating layer I1 is formed on the first source S1, the first drain D1, the second drain D2, the data line DL and the interlayer dielectric layer ILD. A first common electrode C1 and a second common electrode C2 are formed on the first insulating layer I1.

In the present embodiment, a second insulating layer I2 is optionally formed after the formation of the first common electrode C1 and the second common electrode C2. A first pixel electrode PE1 and a second pixel electrode PE2 are formed on the second insulating layer I2. A first opening OP1 and a second opening OP2 are formed through the first insulating layer I1 and the second insulating layer I2. The first pixel electrode PE1 and the second pixel electrode PE2 are electrically connected to the first drain D1 and the second drain D2 through the first opening OP1 and the second opening OP2, respectively. In other words, the present embodiment is exemplified by a structure in which a common electrode is located between a substrate SB and a pixel electrode, but the present invention is not limited thereto. In another embodiment, the pixel electrode is located between the substrate SB and the common electrode.

At this point, an active device substrate 10 is substantially completed. The active device substrate 10 includes a substrate SB, a first scan line SL1, a second scan line SL2, a data line DL, a first active device T1, a first common electrode C1, a second common electrode C2, a first pixel electrode PE1, a second active device T2, and a second pixel electrode PE2.

Based on the above, the first semiconductor channel layer SC1 of the first active device T1 is connected to the second semiconductor channel layer SC2 of the second active device T2, so both the first active device T1 and the second active device T2 can be driven by the same data line DL. As compared with the conventional active device substrate in which each active device is connected to a data line, the active device substrate 10 of the embodiment can be provided with less data lines, so the design space of the first active device T1 and the second active device T2 can be improved, and the aperture ratio of the pixels and the design limit of the resolution can be enhanced.

Figure 3:
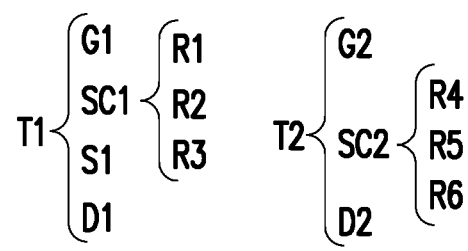
FIG. 3 is a schematic cross-sectional view of an active device substrate in accordance with an embodiment of the present invention.
Figure 3:
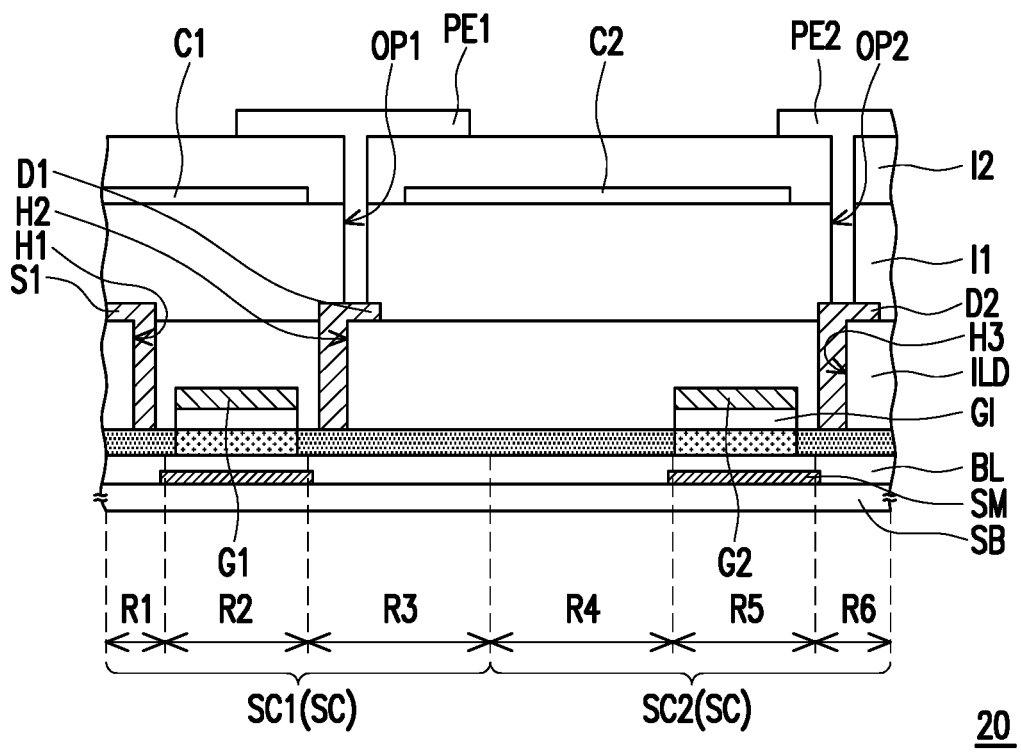

FIG. 3 is a schematic cross-sectional view of an active device substrate in accordance with an embodiment of the present invention. It is noted that the reference numbers of the components and a part of contents of FIG. 2 are also used in the embodiment of FIG. 3, wherein the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the active device substrate 20 of FIG. 3 and the active device substrate 10 of FIG. 2 lies in that, the material of the first semiconductor channel layer SC1 and the second semiconductor channel layer SC2 of the active device substrate 20 includes metal oxide.

In the present embodiment, a heavily doping process and a lightly doping process are not performed on the semiconductor layer. Rather, a plasma treatment process is performed on the semiconductor layer SC to form a first semiconductor channel layer SC1 and a second semiconductor channel layer SC2.

The plasma treatment process can be performed by using a first gate G1 and a second gate G2 as a mask. For example, an insulating layer and a conductive material layer are formed on the semiconductor layer SC. The conductive material layer is etched to form a first scan line SL1, a second scan line SL2, a first gate G1 and a second gate G2, and the insulating layer is etched to form a gate insulating layer GI. The gate insulating layer GI exposes the semiconductor layer SC, and the gate insulating layer GI is aligned with each of the first gate G1 and the second gate G2, for example. Thereafter, the semiconductor layer SC is subjected to a plasma treatment process by using the first scan line SL1, the second scan line SL2, the first gate G1 and the second gate G2 as a mask. In another embodiment, a plasma treatment process is performed before the first gate G1 and the second gate G2 are formed, and the plasma treatment process is performed by using a mask pattern (not shown) additionally formed on the semiconductor layer SC as a mask.

The first semiconductor channel layer SC1 includes a channel region R2 overlapped with the first gate G1, and a source region R1 and a drain region R3 respectively located at two sides of the channel region R2. The resistivity of the source region R1 and the drain region R3 is smaller than the resistivity of the channel region R2.

The second semiconductor channel layer SC2 includes a channel region R5 overlapped with the second gate G2, and a source region R4 and a drain region R6 respectively located at two sides of the channel region R5. The resistivity of the source region R4 and the drain region R6 is smaller than the resistivity of the channel region R5.

Based on the above, the first semiconductor channel layer SC1 of the first active device T1 is connected to the second semiconductor channel layer SC2 of the second active device T2, so both the first active device T1 and the second active device T2 can be driven by the same data line DL. As compared with the conventional active device substrate in which each active device is connected to a data line, the active device substrate 20 of the embodiment can be provided with less data lines, so the design space of the first active device T1 and the second active device T2 can be improved, and the aperture ratio of the pixels and the design limit of the resolution can be enhanced.

Figure 4:
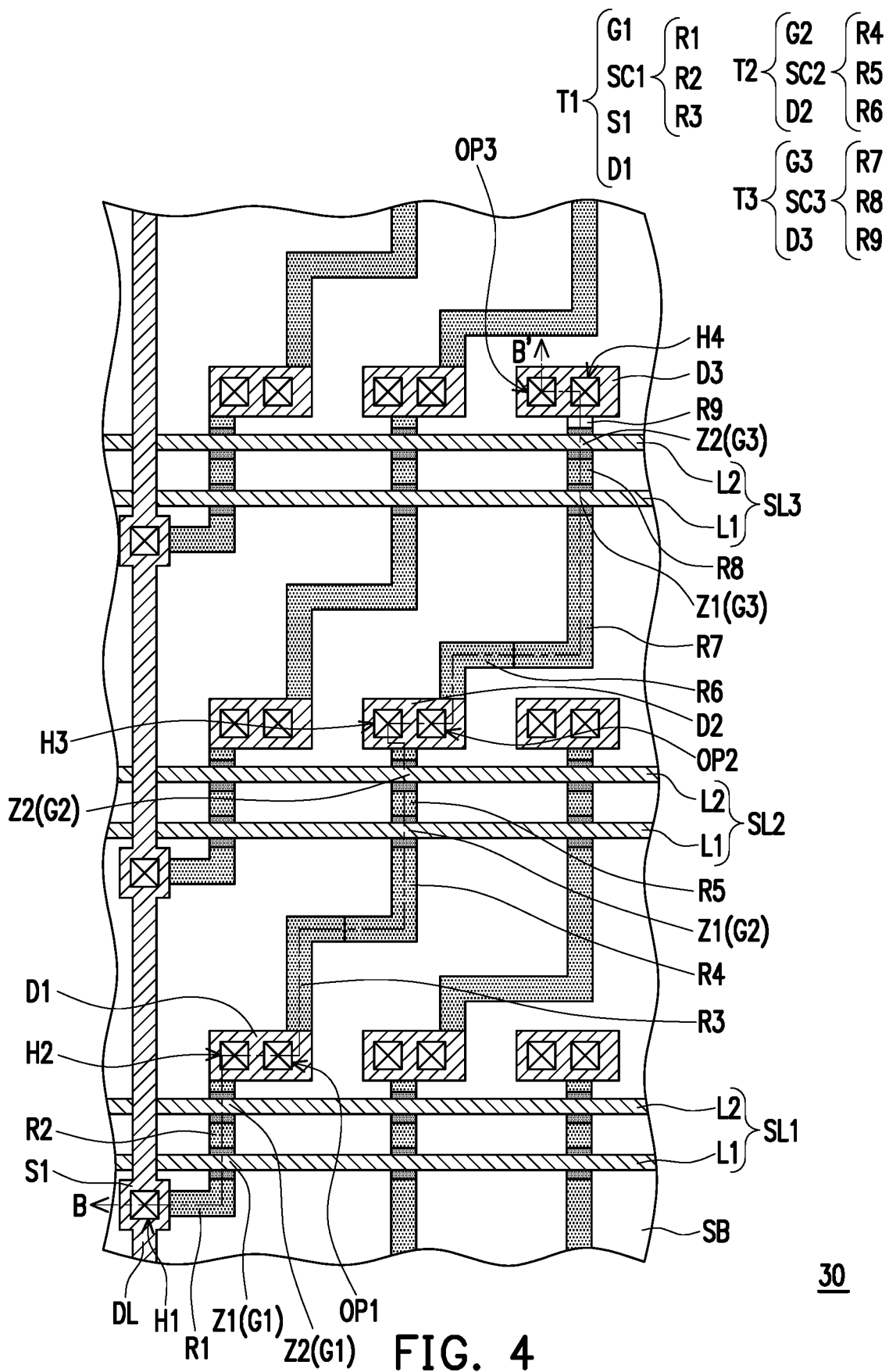
FIG. 4 is a schematic top view of an active device substrate in accordance with an embodiment of the present invention.
Figure 5:
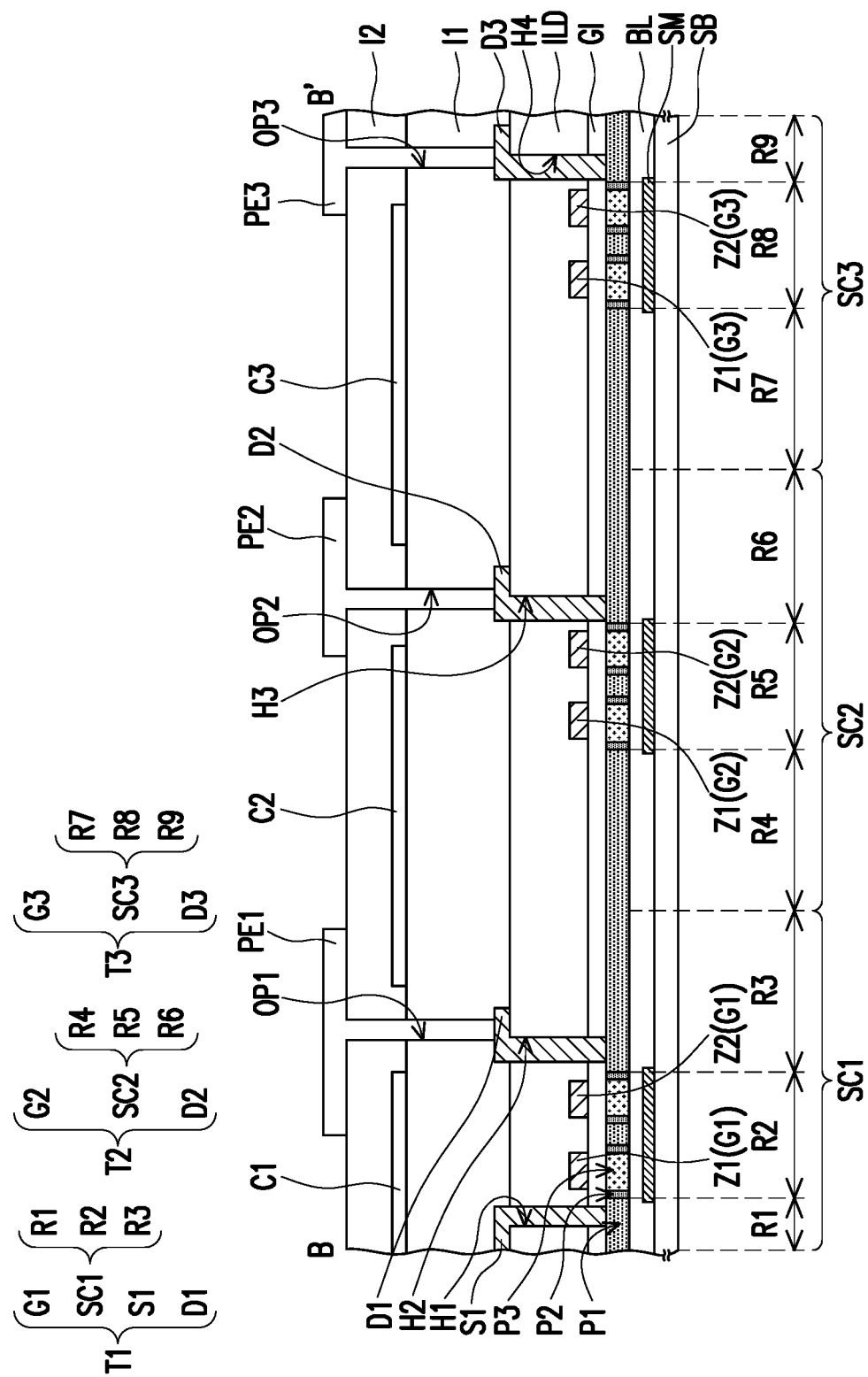
FIG. 5 is a schematic cross-sectional view of an active device substrate in accordance with an embodiment of the present invention.

FIG. 4 is a schematic top view of an active device substrate in accordance with an embodiment of the present invention. FIG. 5 is a schematic cross-sectional view of an active device substrate in accordance with an embodiment of the present invention. FIG. 5 corresponds to a cross-sectional view taken along the line BB' of FIG. 4. It is noted that the reference numbers of the components and a part of contents of FIG. 2 are also used in the embodiments of FIG. 4 and FIG. 5, wherein the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the active device substrate 30 of FIG. 4 and the active device substrate 10 of FIG. 2 lies in that, the active device substrate 30 further includes a third scan line SL3 and a third active device T3, the third active device T3 includes a third semiconductor channel layer SC3, a third gate G3 and a third drain D3.

In the present embodiment, the first metal layer M1 is patterned to form a first scan line SL1, a second scan line SL2, a third scan line SL3, a first gate G1, a second gate G2 and a third gate G3. The first scan line SL1, the second scan line SL2, the third scan line SL3, the first gate G1, the second gate G2 and third gate G3 are located on gate insulating layer GI. The first gate G1 is electrically connected to the first scan line SL1, the second gate G2 is electrically connected to the second scan line SL2, and the third gate G3 is electrically connected to the third scan line SL3.

Each of the first scan line SL1, the second scan line SL2 and the third scan line SL3 includes a first conductive line L1 and a second conductive line L2 parallel to each other. Each of the first gate G1, the second gate G2 and the third gate G3 includes a first part Z1 and a second part Z2 separated from each other. The first part Z1 and the second part Z2 are electrically connected to the first conductive line L1 and the second conductive line L2, respectively.

A treatment process is performed on the semiconductor layer SC to form a first semiconductor channel layer SC1, a second semiconductor channel layer SC2 and a third semiconductor channel layer SC3. In the present embodiment, the treatment process a similar to the heavily doping process of FIG. 1C, and the heavily doping process (FIG. 1C) and the lightly doping process (FIG. 1D) are performed on the semiconductor layer SC to form the first semiconductor channel layer SC1, the second semiconductor channel layer SC2 and the third semiconductor channel layer SC3. However, the invention is not limited thereto. In another embodiment, the material of the semiconductor layer SC includes metal oxide, and the treatment process is a plasma treatment process. In the present embodiment, the first semiconductor channel layer SC1, the second semiconductor channel layer SC2 and the third semiconductor channel layer SC3 belong to the same layer. The third semiconductor channel layer SC3 includes a source region R7, a channel region R8 and a drain region R9 connected in sequence. The third gate G3 is overlapped with the channel region R8 of the third semiconductor channel layer SC3.

The first semiconductor channel layer SC1, the second semiconductor channel layer SC2 and the third semiconductor channel layer SC3 are sequentially connected. For example, the drain region R3 of the first semiconductor channel layer SC1 is connected to the source region R4 of the second semiconductor channel layer SC2, and the drain region R6 of the second semiconductor channel layer SC2 is connected to the source region R7 of the third semiconductor channel layer SC3.

The third drain D3 is electrically connected to the drain region R9 of the third semiconductor channel layer SC3 through the opening H4. The third pixel electrode PE3 is electrically connected to the third drain D3 through the opening OP3. A first common electrode C1, a second common electrode C2 and a third common electrode C3 are overlapped with the first pixel electrode PE1, the second pixel electrode PE2 and the third pixel electrode PE3.

Based on the above, the first semiconductor channel layer SC1 of the first active device T1 is connected to the second semiconductor channel layer SC2 of the second active device T2, and the second semiconductor channel layer SC2 of the second active device T2 is connected to the third semiconductor channel layer SC3 of the third active device T3, and therefore, the first active device T1, the second active device T2 and the third active device T3 can all be driven by the same data line DL. As compared with the conventional active device substrate in which each active device is connected to a data line, the active device substrate 30 of the embodiment can be provided with less data lines, so the design space of the first active device T1, the second active device T2 and the third active device T3 can be improved, and the aperture ratio of the pixels and the design limit of the resolution can be enhanced.

The present embodiment is exemplified by semiconductor channel layers of three active devices that are connected in sequence, but the present invention is not limited thereto. In another embodiment, semiconductor channel layers of more than three active devices can be connected in sequence.

FIG. 6A to FIG. 6D are schematic top views of a method of manufacturing an active device substrate in accordance with an embodiment of the present invention. FIG. 7 is a schematic cross-sectional view of an active device substrate in accordance with an embodiment of the present invention. FIG. 7 corresponds to a cross-sectional view taken along the line CC' of FIG. 6D.

It is noted that the reference numbers of the components and a part of contents of FIG. 1A to FIG. 1F and FIG. 2 are also used in the embodiments of FIG. 6A to FIG. 6D and FIG. 7, wherein the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the embodiment of FIG. 6A to FIG. 6D and the embodiment of FIG. 1A to FIG. 1F lies in that, in the manufacturing method of active device substrate 40 of FIG. 6A to FIG. 6D, a treatment process is performed before the first scan line SL1, the second scan line SL2, the first gate G1 and the second gate G2 are formed on the gate insulating layer GI.

Figure 6A:
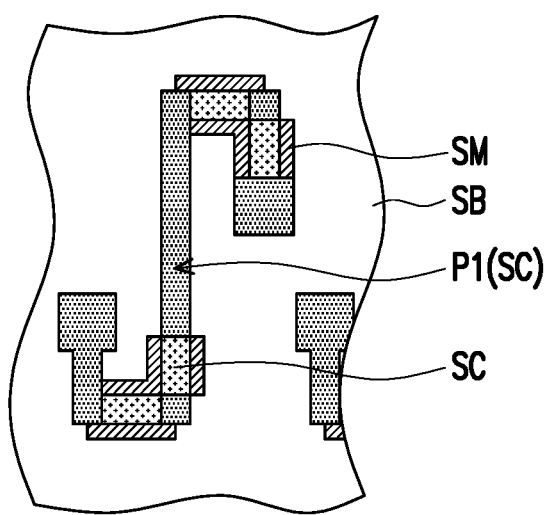
FIG. 6A to FIG. 6D are schematic top views of a method of manufacturing an active device substrate in accordance with an embodiment of the present invention.
Figure 7:
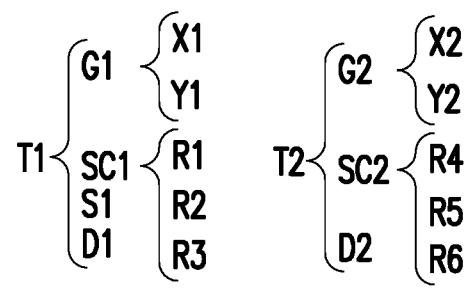
FIG. 7 is a schematic cross-sectional view of an active device substrate in accordance with an embodiment of the present invention.
Figure 7:
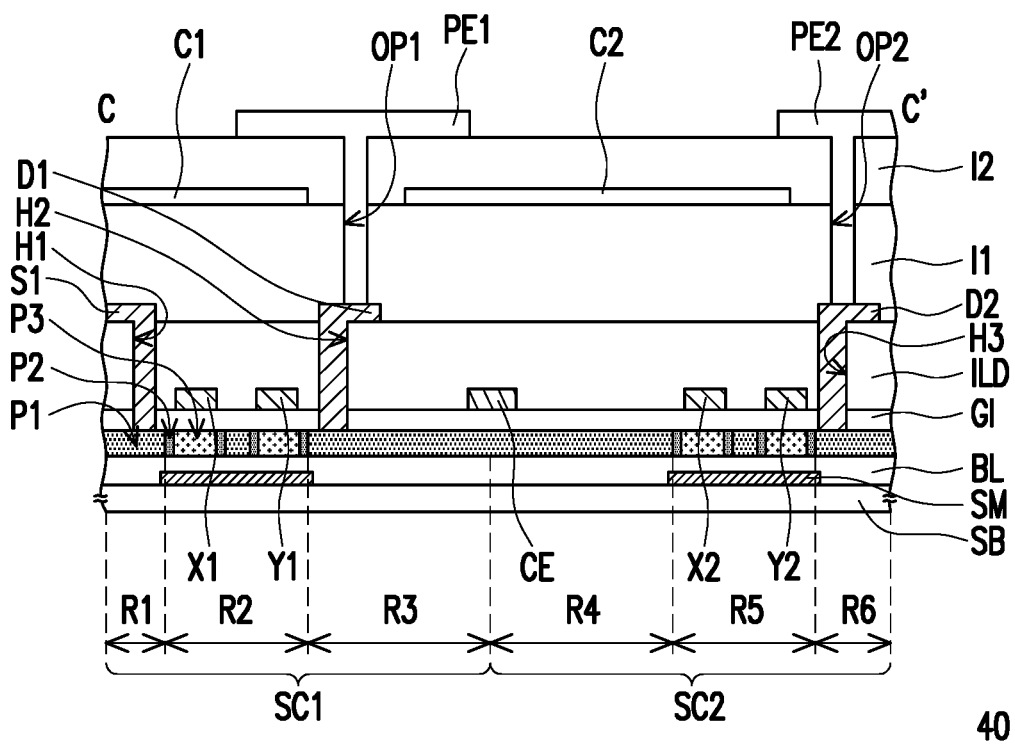

The step of FIG. 6A follows the manufacturing step of FIG. 1B. Referring to FIG. 6A and FIG. 7, a treatment process is performed on the semiconductor layer SC to form a heavily doped region P1 in the semiconductor layer SC. The treatment process is a heavily doping process, for example.

In the present embodiment, for example, a mask pattern (not shown) is formed on the semiconductor layer SC to define a region in the semiconductor layer SC where the heavily doped region P1 is to be formed, and then the mask pattern is removed. The mask pattern can be formed before the formation of the gate insulating layer GI or after the formation of the gate insulating layer GI, and the forming sequence is not particularly limited by the present invention.

Figure 6B:
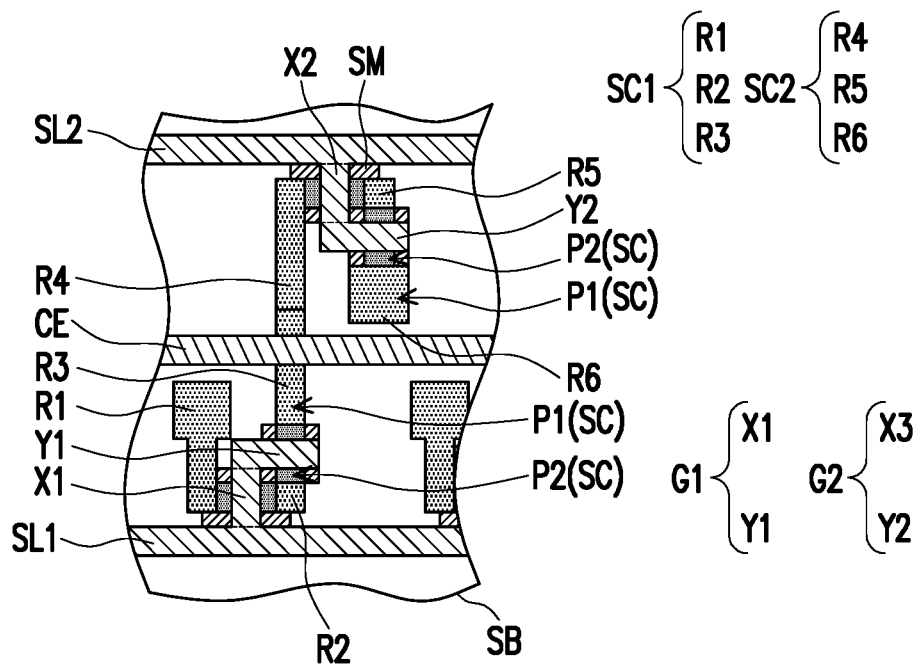

Referring to FIG. 6B and FIG. 7, a first scan line SL1, a second scan line SL2, a first gate G1 and a second gate G2 are formed on gate insulating layer GI. The first gate G1 and the second gate G2 are overlapped with the semiconductor layer SC, and the overlapped area is smaller than the area where the semiconductor layer SC is not subjected to the heavily doping process. After the first scan line SL1, the second scan line SL2, the first gate G1 and the second gate G2 are formed on the gate insulating layer GI, a lightly doping process is performed on the semiconductor layer SC by using the first scan line SL1, the second scan line SL2, the first gate G1 and the second gate G2 as a mask, so as to form a lightly doped region P2 in the semiconductor layer SC.

In the present embodiment, while the first scan line SL1, the second scan line SL2, the first gate G1 and the second gate G2 are formed on the gate insulating layer GI, a capacitor electrode CE is simultaneously formed on the gate insulating layer GI. In other words, the capacitor electrode CE, the first scan line SL1, the second scan line SL2, the first gate G1 and second gate G2 belong to the same layer. The extending direction of the capacitor electrode CE, the extending direction of the first scan line SL1, and the extending direction of the second scan line SL2 are substantially the same, but the invention is not limited thereto.

In the present embodiment, the capacitor electrode CE, the first scan line SL1, the second scan line SL2, the first gate G1 and the second gate G2 belong to the same layer. Besides, the capacitor electrode CE is overlapped with the semiconductor layer SC; that is, the capacitor electrode CE is overlapped with the first semiconductor channel layer SC1 and/or the second semiconductor channel layer SC2. Therefore, the lightly doping process is performed by using the capacitor electrode CE, the first scan line SL1, the second scan line SL2, the first gate G1 and the second gate G2 as a mask. In the present embodiment, the capacitor electrode CE can constitute a capacitor with the first semiconductor channel layer SC1 and/or the second semiconductor channel layer SC2.

Figure 6C:
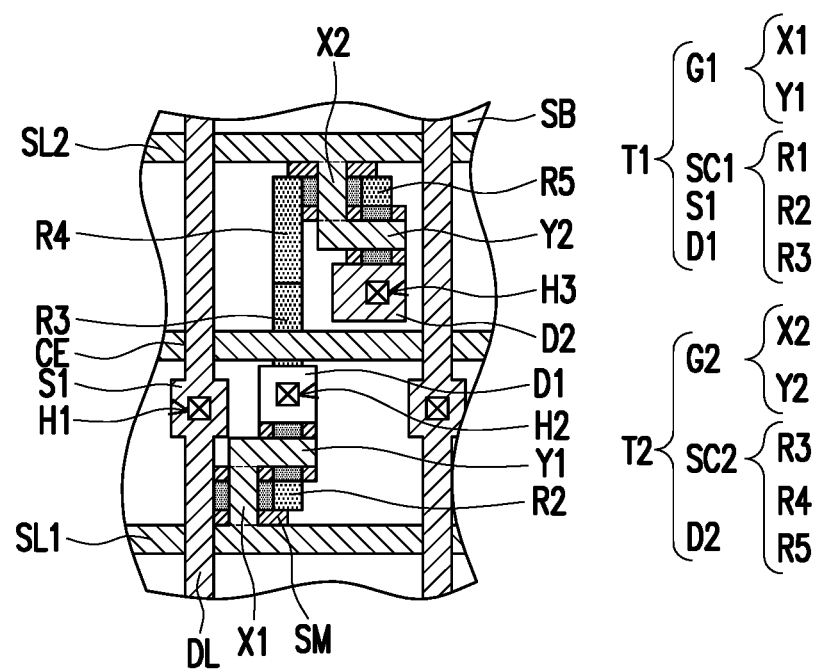

Referring to FIG. 6C and FIG. 7, an interlayer dielectric layer ILD is formed on the first scan line SL1, the second scan line SL2, the first gate G1, the second gate G2 and the capacitor electrode CE.

A first source S1, a data line DL, a first drain D1 and a second drain D2 are formed on the interlayer dielectric layer ILD. The first source S1 is electrically connected to the data line DL and the first semiconductor channel layer SC1. The first drain D1 and the second drain D2 are electrically connected to the first semiconductor channel layer SC1 and the second semiconductor channel layer SC2, respectively. In the present embodiment, the interlayer dielectric layer ILD has openings H1, H2 and H3. The first source S1 is electrically connected to the source region R1 of the first semiconductor channel layer SC1 through the opening H1. The first drain D1 and the second drain D2 are respectively electrically connected to the drain region R3 of the first semiconductor channel layer SC1 and the drain region R6 of the second semiconductor channel layer SC2 through the opening H2 and opening H3.

At this point, a first active device T1 and a second active device T2 are substantially completed.

Figure 6D:
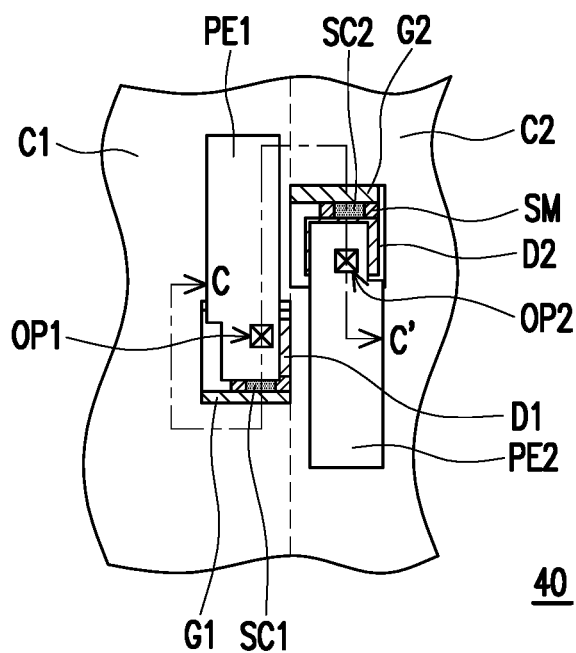

Refer to FIG. 6D and FIG. 7, a first insulating layer I1 is formed on the first source S1, the first drain D1, the second drain D2, the data line DL and the interlayer dielectric layer ILD. A first common electrode C1 and a second common electrode C2 are formed on the first insulating layer I1.

In the present embodiment, a second insulating layer I2 is optionally formed after the formation of the first common electrode C1 and the second common electrode C2. A first pixel electrode PE1 and a second pixel electrode PE2 are formed after the formation of the second insulating layer I2. The first pixel electrode PE1 and the second pixel electrode PE2 are located on the second insulating layer I2. A first opening OP1 and a second opening OP2 are formed through the first insulating layer I1 and the second insulating layer I2. In other words, the present embodiment is exemplified by a structure in which a common electrode is located between a substrate SB and a pixel electrode, but the present invention is not limited thereto. In another embodiment, the pixel electrode is located between the substrate SB and the common electrode.

At this point, an active device substrate 40 is substantially completed. The active device substrate 40 includes a substrate SB, a first scan line SL1, a second scan line SL2, a data line DL, a first active device T1, a first common electrode C1, a second common electrode C2, a first pixel electrode PE1, a second active device T2, a second pixel electrode PE2 and capacitor electrode CE.

Based on the above, the first semiconductor channel layer SC1 of the first active device T1 is connected to the second semiconductor channel layer SC2 of the second active device T2, so both the first active device T1 and the second active device T2 can be driven by the same data line DL. As compared with the conventional active device substrate in which each active device is connected to a data line, the active device substrate 40 of the embodiment can be provided with less data lines, so the design space of the first active device T1 and the second active device T2 can be improved, and the aperture ratio of the pixels and the design limit of the resolution can be enhanced.

Figure 8:
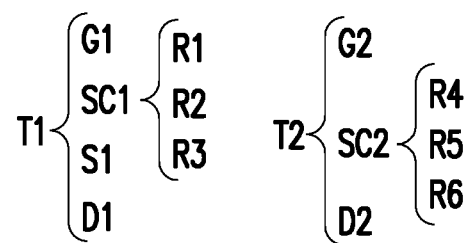
FIG. 8 is a schematic cross-sectional view of an active device substrate in accordance with an embodiment of the present invention.
Figure 8:
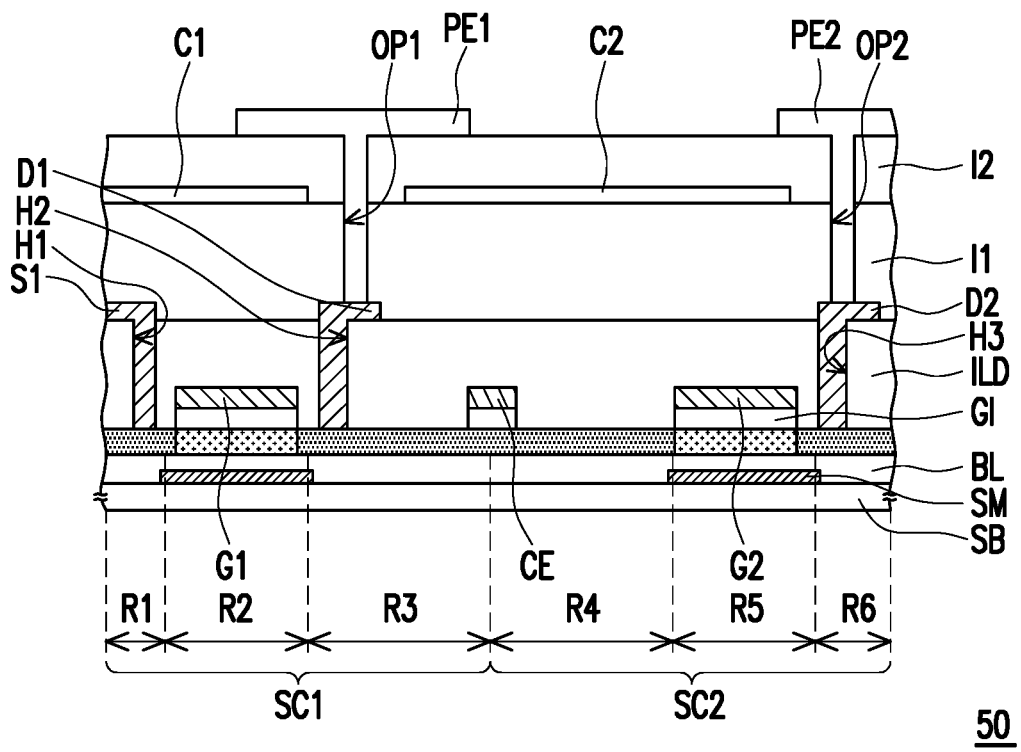

FIG. 8 is a schematic cross-sectional view of an active device substrate in accordance with an embodiment of the present invention. It is noted that the reference numbers of the components and a part of contents of FIG. 7 are also used in the embodiment of FIG. 8, wherein the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the active device substrate 50 of FIG. 8 and the active device substrate 40 of FIG. 7 lies in that, the material of the first semiconductor channel layer SC1 and the second semiconductor channel layer SC2 of the active device substrate 50 includes metal oxide.

In the present embodiment, the gate insulating layer GI exposes the semiconductor layer, and the gate insulating layer GI is aligned with each of the first gate G1, the second gate G2 and the capacitor electrode CE, for example. In the present embodiment, a heavily doping process and a lightly doping process are not performed on the semiconductor layer. Rather, a plasma treatment process is performed on the semiconductor layer SC to form a first semiconductor channel layer SC1 and a second semiconductor channel layer SC2.

In the present embodiment, the plasma treatment process can be performed by using a mask pattern (not shown) additionally formed on the semiconductor layer SC as a mask. For example, before the first gate G1, the second gate G2 and the capacitor electrode CE are formed, a mask pattern is formed on the semiconductor layer SC to define regions (i.e., source regions R1 and R4, and drain region R3 and R6) to be subjected to a plasma treatment process. A first gate G1, a second gate G2 and a capacitor electrode CE are formed after the plasma treatment process. The aforementioned mask pattern is removed after the plasma treatment process is performed.

The first semiconductor channel layer SC1 includes a channel region R2 overlapped with the first gate G1, and a source region R1 and a drain region R3 respectively located at both sides of the channel region R2. The resistivity of the source region R1 and the drain region R3 is smaller than the resistivity of the channel region R2.

The second semiconductor channel layer SC2 includes a channel region R5 overlapped with the second gate G2, and a source region R4 and a drain region R6 respectively located at both sides of the channel region R5. The resistivity of the source region R4 and the drain region R6 is smaller than the resistivity of the channel region R5.

Based on the above, the first semiconductor channel layer SC1 of the first active device T1 is connected to the second semiconductor channel layer SC2 of the second active device T2, so both the first active device T1 and the second active device T2 can be driven by the same data line DL. As compared with the conventional active device substrate in which each active device is connected to a data line, the active device substrate 50 of the embodiment can be provided with less data lines, so the design space of the first active device T1 and the second active device T2 can be improved, and the aperture ratio of the pixels and the design limit of the resolution can be enhanced.

Figure 9:
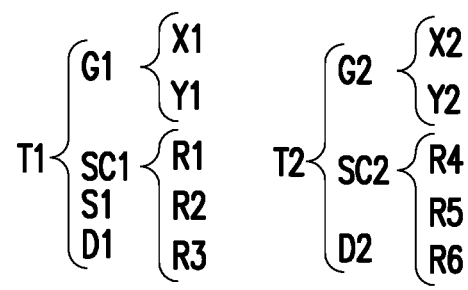
FIG. 9 is a schematic cross-sectional view of an active device substrate in accordance with an embodiment of the present invention.
Figure 9:
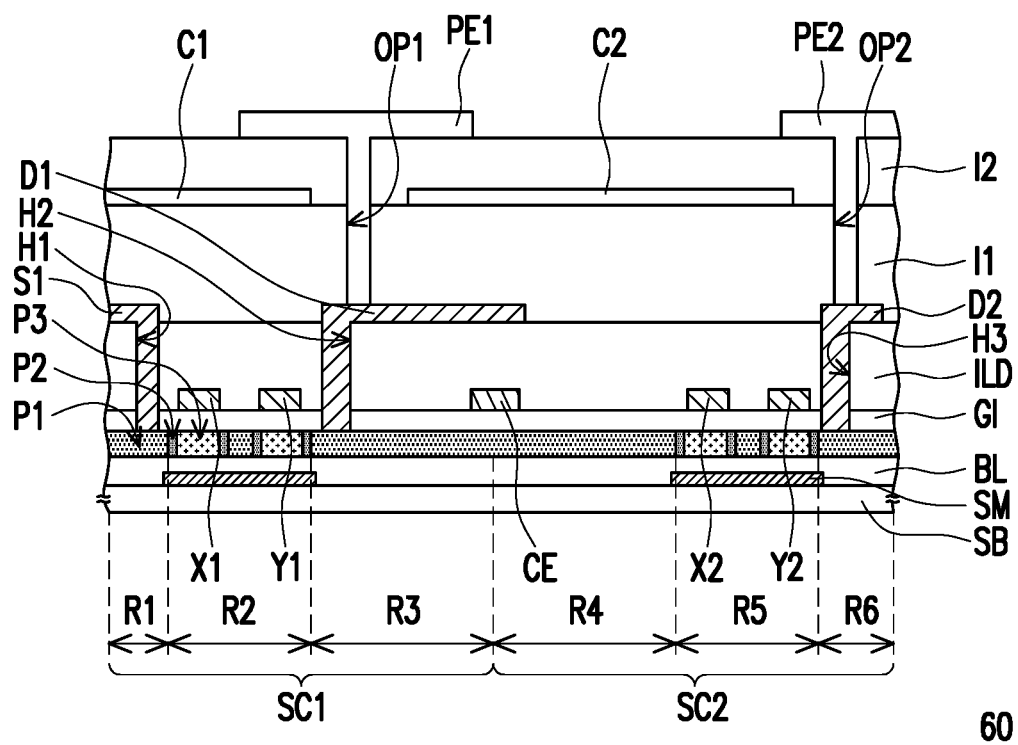

FIG. 9 is a schematic cross-sectional view of an active device substrate in accordance with an embodiment of the present invention. It must be note that the reference numbers of the components and a part of contents of FIG. 7 are also used in the embodiment of FIG. 9, and the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the active device substrate 60 of FIG. 9 and the active device substrate 40 of FIG. 7 lies in that, the first drain D1 is overlapped with the capacitor electrode CE.

In the preset embodiment, the capacitor electrode CE can not only constitute a capacitor with the first semiconductor channel layer SC1 and/or the second semiconductor channel layer SC2, but also constitute a capacitor with the first drain D1.

Based on the above, the capacitor electrode CE of this embodiment can provide a higher storage capacitance.

Figure 10:
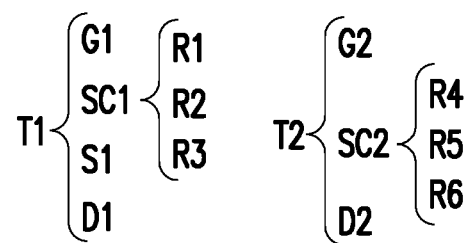
FIG. 10 is a cross-sectional view of an active device substrate in accordance with an embodiment of the present invention.
Figure 10:
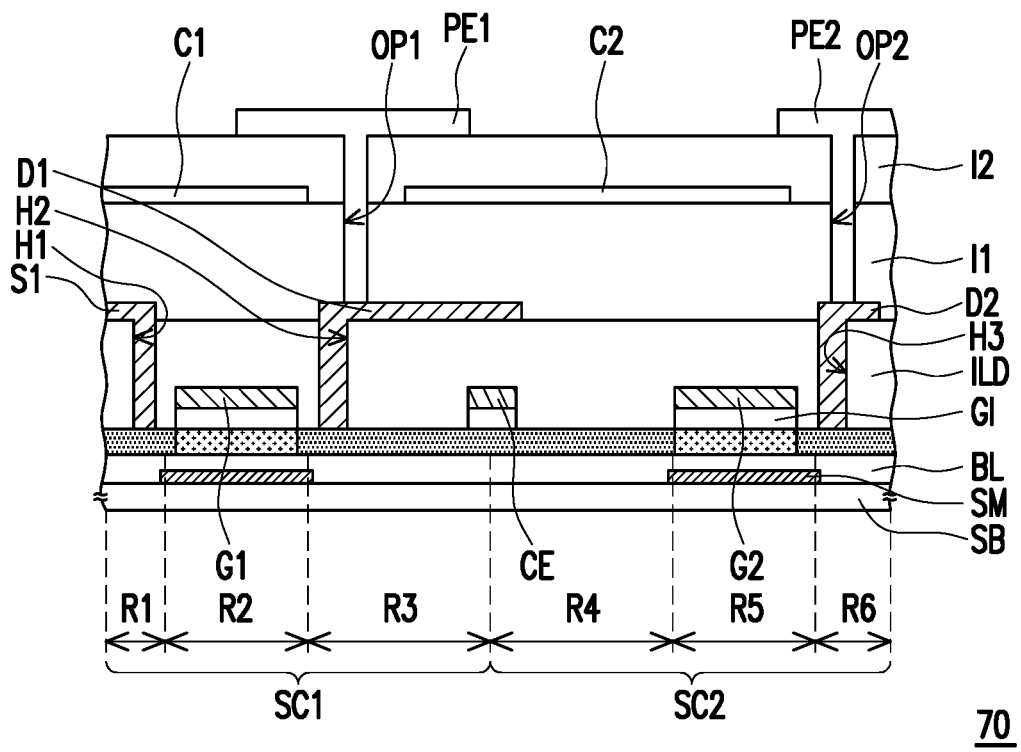

FIG. 10 is a cross-sectional view of an active device substrate in accordance with an embodiment of the present invention. It must be note that the reference numbers of the components and a part of contents of FIG. 8 are also used in the embodiment of FIG. 10, and the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the active device substrate 70 of FIG. 10 and the active device substrate 50 of FIG. 8 lies in that, the first drain D1 is overlapped with the capacitor electrode CE.

In the preset embodiment, the capacitor electrode CE can not only constitute a capacitor with the first semiconductor channel layer SC1 and/or the second semiconductor channel layer SC2, but also constitute a capacitor with the first drain D1.

Based on the above, the capacitor electrode CE of this embodiment can provide a higher storage capacitance.

FIG. 11A to FIG. 11G are schematic top views of a method of manufacturing an active device substrate in accordance with an embodiment of the present invention. FIG. 12 is a schematic cross-sectional view of an active device substrate in accordance with an embodiment of the present invention. FIG. 12 corresponds to a cross-sectional view taken along the line DD' of FIG. 11G.

It is noted that the reference numbers of the components and a part of contents of FIG. 1A to FIG. 1F and FIG. 2 are also used in the embodiments of FIG. 11A to FIG. 11G and FIG. 12, wherein the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the active device substrate 80 of FIG. 11 and FIG. 12 and the active device substrate 10 of FIG. 1F and FIG. 2 lies in that, the active device substrate 80 further includes a first island structure IS1 and a second island structure IS2.

Figure 11A:
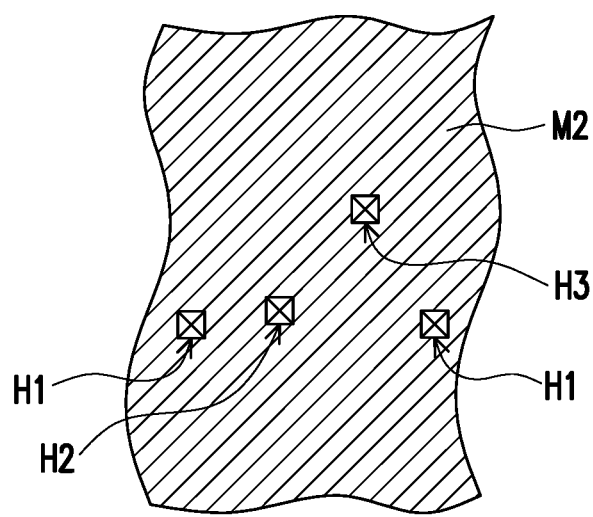
FIG. 11A to FIG. 11G are schematic top views of a method of manufacturing an active device substrate in accordance with an embodiment of the present invention.
Figure 12:
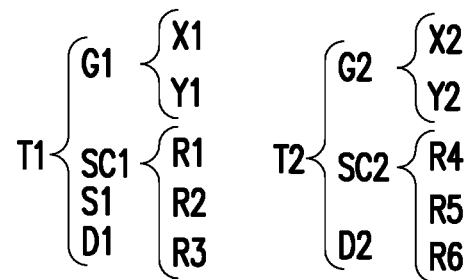
FIG. 12 is a schematic cross-sectional view of an active device substrate in accordance with an embodiment of the present invention.
Figure 12:
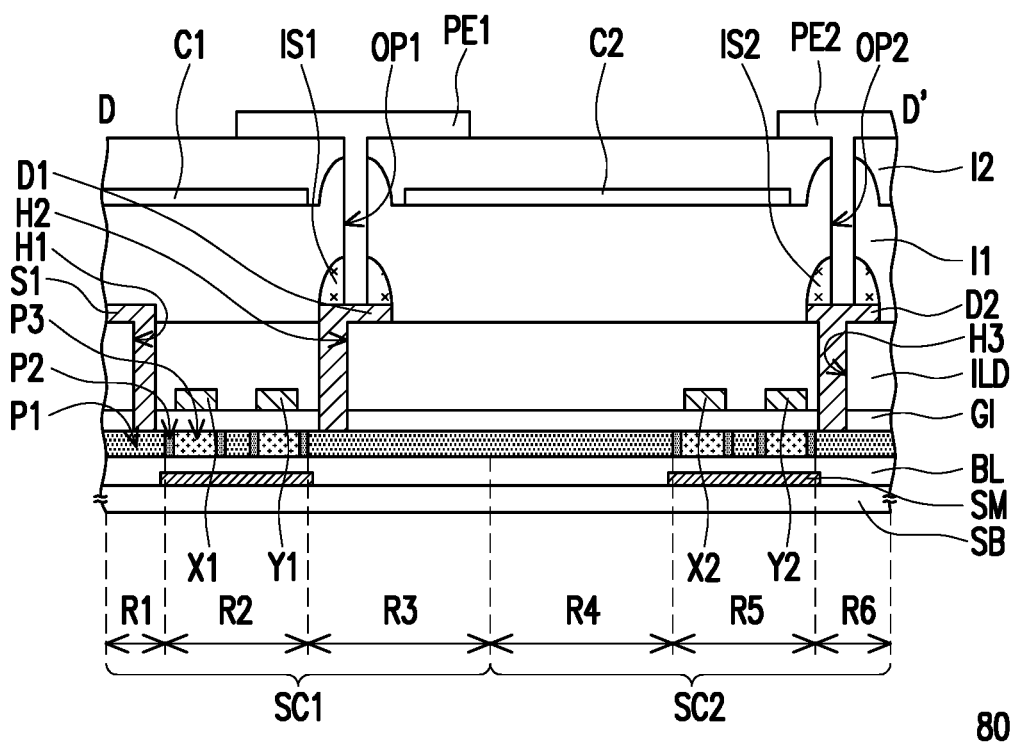

The step of FIG. 11A follows the manufacturing step of FIG. 1D. Referring to FIG. 11A and FIG. 12, an interlayer dielectric layer ILD is formed on the first scan line SL1, the second scan line SL2, the first gate G1 and the second gate G2. The interlayer dielectric layer ILD has openings H1, H2 and H3. A second metal layer M2 is formed on the interlayer dielectric layer ILD.

Figure 11B:
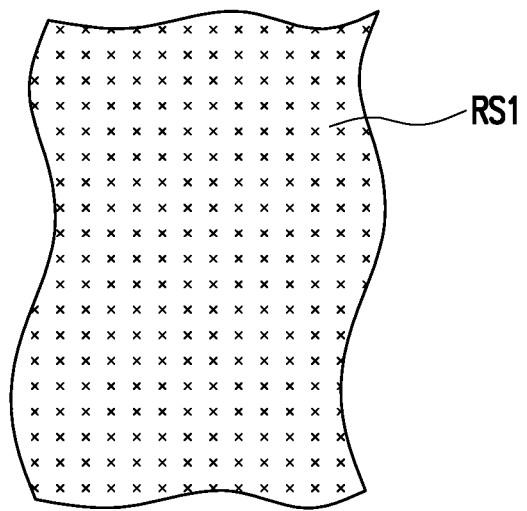
Figure 11C:
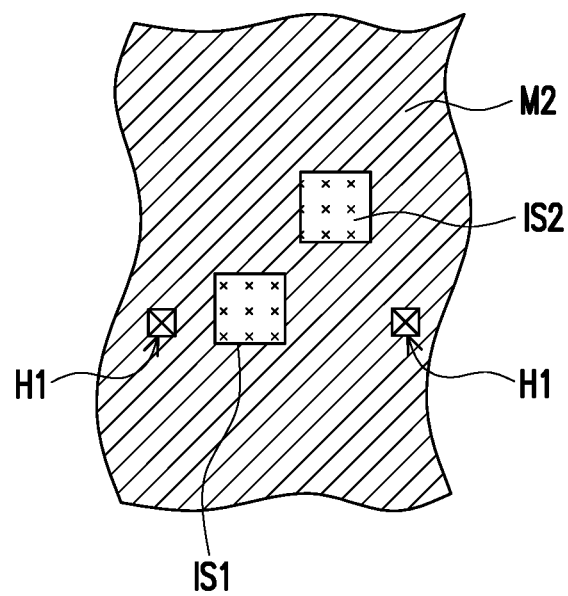

Referring to FIG. 11B and FIG. 11C, a first photosensitive material RS1 is formed on the second metal layer M2. The first photosensitive material RS1 is patterned, and then the patterned first photosensitive material RS1 is cured to form a first island structure IS1 and a second island structure IS2 on the second metal layer M2. In other words, the material of the first island structure IS1 and the second island structure IS2 includes a cured photosensitive material. The first island structure IS1 and the second island structure IS2 are configured to correspond to the opening H2 and opening H3, respectively.

Figure 11D:
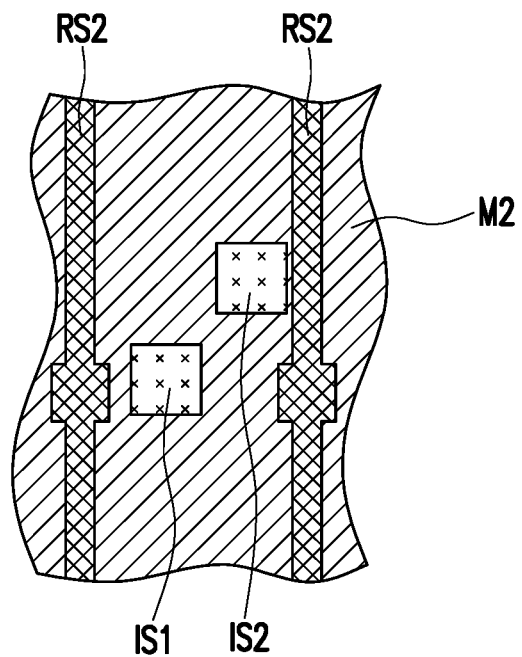

Referring to FIG. 11D and FIG. 12, a patterned second photosensitive material RS2 is formed on the second metal layer M2. The patterned second photosensitive material RS2 is configured to correspond to the opening H1. In the present embodiment, the curing degree of the first island structure IS1 and the second island structure IS2 can be greater than the curing degree of the patterned second photosensitive material RS2, and therefore, the first island structure IS1 and the second island structure IS2 are less susceptible to damage during the process (e.g., a developing process) of forming the patterned second photosensitive material RS2.

Figure 11E:
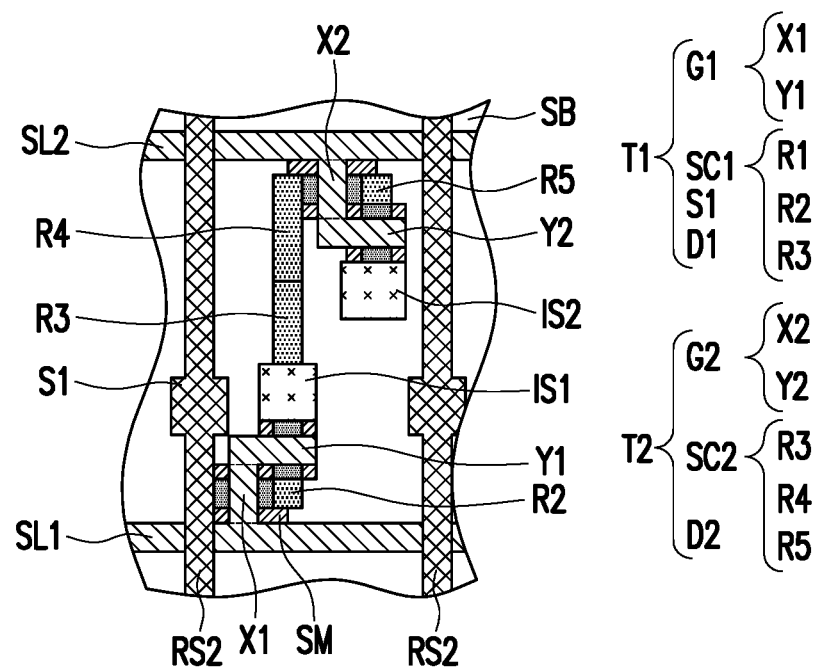
Figure 11F:
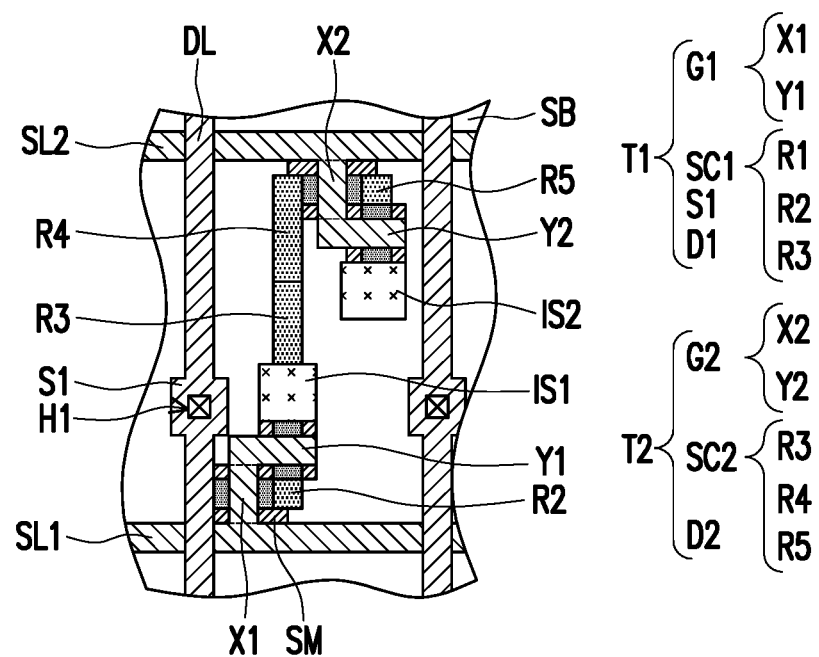

Referring to FIG. 11E, FIG. 11F and FIG. 12, the second metal layer M2 is patterned by using the second source material RS2, the first island structure IS1 and the second island structure IS2 as a mask, so as to form a first source S1, a data line DL, a first drain D1 and a second drain D2. The first source S1 is electrically connected to the source region R1 of the first semiconductor channel layer SC1 through the opening H1. The first drain D1 and the second drain D2 are respectively electrically connected to the drain region R3 of the first semiconductor channel layer SC1 and the drain region R6 of the second semiconductor channel layer SC2 through the opening H2 and the opening H3. The first island structure IS1 and the second island structure IS2 are located above the first drain D1 and the second drain D2, respectively. The patterned second photosensitive material RS2 is located above the data line DL. The vertical projection area of the first island structure IS1 on the substrate SB is substantially the same as the vertical projection area of the first drain D1 on the substrate SB. The vertical projection area of the second island structure IS2 on the substrate SB is substantially the same as the vertical projection area of the second drain D2 on the substrate SB. The vertical projection area of the patterned second photosensitive material RS2 on the substrate SB is substantially the same as the vertical projection area of the data line DL on the substrate SB.

The patterned second photosensitive material RS2 is removed (or stripped). The curing degree of the first island structure IS1 and the second island structure IS2 can be greater than the curing degree of the patterned second photosensitive material RS2, and thus, the first island structure IS1 and the second island structure IS2 remain after the patterned second photosensitive material RS2 is removed.

In the present embodiment, the process of forming the first island structure IS1, the second island structure IS2 and the patterned second photosensitive material RS2 includes two patterning steps, so that the resolution limit of forming the first source S1, the data line DL, the first drain D1 and the second drain D2 is improved. In other words, the distance between any two of the first source S1, the data line DL, the first drain D1 and second drain D2 can be reduced.

Figure 11G:
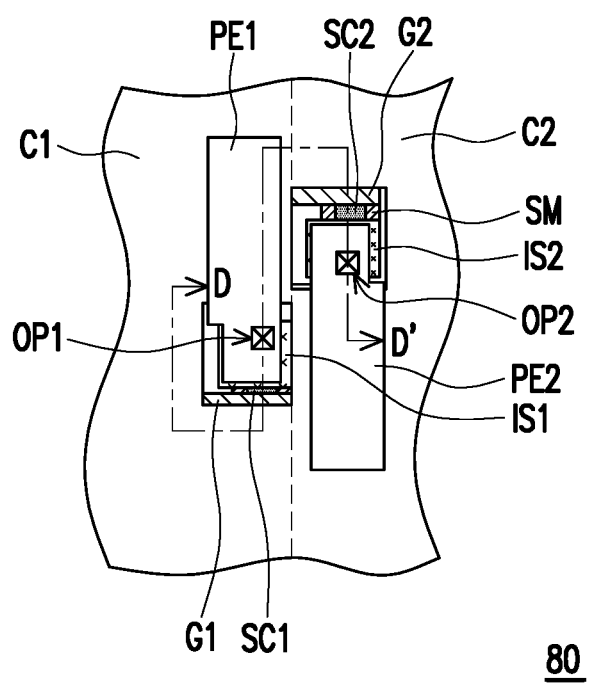

Referring to FIG. 11G and FIG. 12, a first insulating layer I1 is formed on the first source S1, the first drain D1, the second drain D2, the data line DL, the interlayer dielectric layer ILD, the first island structure IS1 and the second island structure IS2. The first insulating layer I1 covers the first island structure IS1, the second island structure IS2 and the data line DL.

A first common electrode C1 and a second common electrode C2 are formed on the first insulating layer I1.

In the present embodiment, a second insulating layer I2 is optionally formed after the formation of the first common electrode C1 and the second common electrode C2. A first pixel electrode PE1 and a second pixel electrode PE2 are formed after the formation of the second insulating layer I2. The first pixel electrode PE1 is electrically connected to the first drain D1 through the first opening OP1, and the second pixel electrode PE2 is electrically connected to the second drain D2 through the second opening OP2. The first opening OP1 penetrates through the first island structure IS1 and the first insulating layer I1, and the second opening OP2 penetrates through the second island structure IS2 and the first insulating layer I1. In other words, the present embodiment is exemplified by a structure in which a common electrode is located between a substrate SB and a pixel electrode, but the present invention is not limited thereto. In another embodiment, the pixel electrode is located between the substrate SB and the common electrode.

At this point, an active device substrate 80 is substantially complete. The active device substrate 80 includes a substrate SB, a first scan line SL1, a second scan line SL2, a data line DL, a first active device T1, a first pixel electrode PE1, a second active device T2, a second pixel electrode PE2, a first island structure IS1 and a second island structure IS2.

Based on the above, the first semiconductor channel layer SC1 of the first active device T1 is connected to the second semiconductor channel layer SC2 of the second active device T2, so both the first active device T1 and the second active device T2 can be driven by the same data line DL. As compared with the conventional active device substrate in which each active device is connected to a data line, the active device substrate 80 of the embodiment can be provided with less data lines, so the design space of the first active device T1 and the second active device T2 can be improved, and the aperture ratio of the pixels and the design limit of the resolution can be enhanced.

Figure 13:
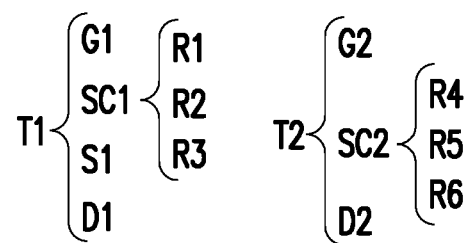
FIG. 13 is a schematic cross-sectional view of an active device substrate in accordance with an embodiment of the present invention.
Figure 13:
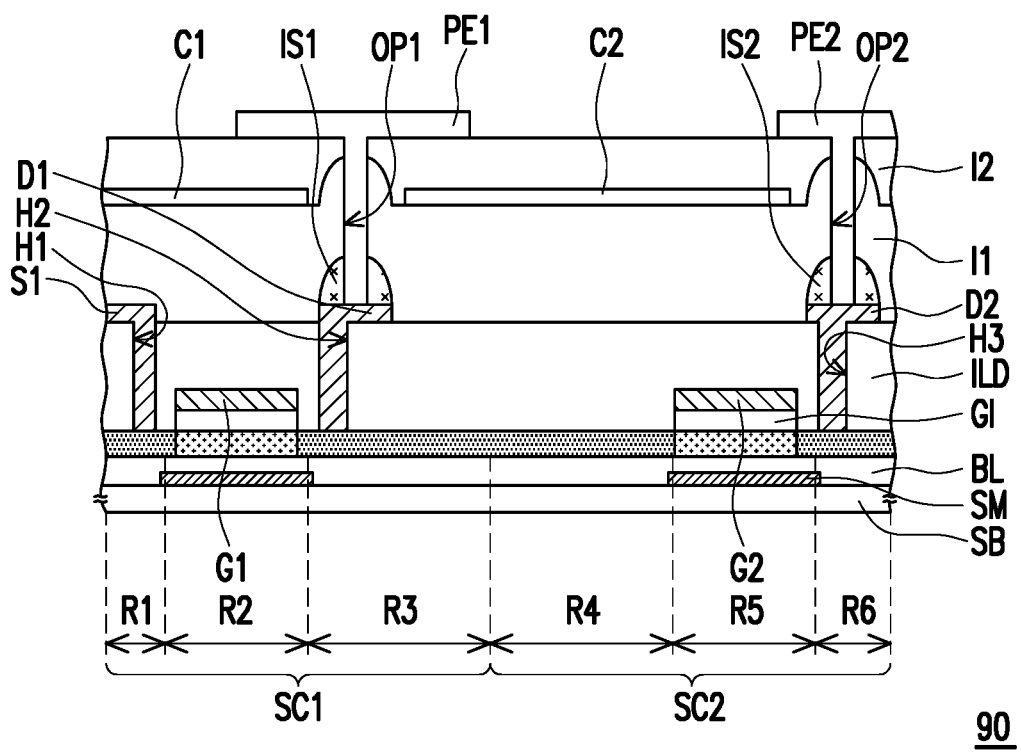

FIG. 13 is a schematic cross-sectional view of an active device substrate in accordance with an embodiment of the present invention. It is noted that the reference numbers of the components and a part of contents of FIG. 12 are also used in the embodiment of FIG. 13, wherein the same reference numbers denote the same or like components, and descriptions of the same technical contents are omitted. The aforementioned embodiment can be referred for descriptions of the omitted parts, and detailed descriptions thereof are not repeated in the following embodiment.

The main difference between the active device substrate 90 of FIG. 13 and the active device substrate 80 of FIG. 12 lies in that, the material of the first semiconductor channel layer SC1 and the second semiconductor channel layer SC2 of the active device substrate 90 includes metal oxide.

In the present embodiment, a heavily doping process and a lightly doping process are not performed on the semiconductor layer. Rather, a plasma treatment process is performed on the semiconductor layer to form a first semiconductor channel layer SC1 and a second semiconductor channel layer SC2.

The first semiconductor channel layer SC1 includes a channel region R2 overlapped with the first gate G1, and a source region R1 and a drain region R3 respectively located at both sides of the channel region R2. The resistivity of the source region R1 and the drain region R3 is smaller than the resistivity of the channel region R2.

The second semiconductor channel layer SC2 includes a channel region R5 overlapped with the second gate G2, and a source region R4 and a drain region R6 respectively located at both sides of the channel region R5. The resistivity of the source region R4 and the drain region R6 is smaller than the resistivity of the channel region R5.

Based on the above, the first semiconductor channel layer SC1 of the first active device T1 is connected to the second semiconductor channel layer SC2 of the second active device T2, so both the first active device T1 and the second active device T2 can be driven by the same data line DL. As compared with the conventional active device substrate in which each active device is connected to a data line, the active device substrate 90 of the embodiment can be provided with less data lines, so the design space of the first active device T1 and the second active device T2 can be improved, and the aperture ratio of the pixels and the design limit of the resolution can be enhanced.

In summary, the first active device and the second active device of the present invention can be driven by the same data line. As compared with the conventional active device substrate in which each active device is connected to a data line, the active device substrate of the invention can be provided with less data lines, so the design space of the first active device and the second active device can be improved, and the aperture ratio of the pixels and the design limit of the resolution can be enhanced.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An active device substrate, comprising:
   a substrate;
   a first scan line, a second scan line and a data line, disposed on the substrate;
   a first active device, comprising:
      a first semiconductor channel layer;
      a first gate, overlapped with the first semiconductor channel layer and electrically connected to the first scan line;
      a first source, electrically connected to the data line and the first semiconductor channel layer; and
      a first drain, electrically connected to the first semiconductor channel layer;
   a first pixel electrode, electrically connected to the first drain;
   a first island structure, located on the first drain;
   a second active device, comprising:
      a second semiconductor channel layer, wherein the first semiconductor channel layer is connected to a source region of the second semiconductor channel layer, and the first semiconductor channel layer and the second semiconductor channel layer belong to a same layer;
      a second gate, overlapped with the second semiconductor channel layer and electrically connected to the second scan line; and
      a second drain, electrically connected to the second semiconductor channel layer; and
   a second pixel electrode, electrically connected to the second drain;
   a second island structure, located on the second drain; and
   a first insulating layer, covering the first island structure, the second island structure and the data line, wherein the first pixel electrode is electrically connected to the first drain through a first opening, the second pixel electrode is electrically connected to the second drain through a second opening, the first opening penetrates through the first island structure and the first insulating layer, and the second opening penetrates through the second island structure and the first insulating layer.

2. The active device substrate of claim 1, further comprising:
   a third scan line; and
   a third active device, comprising:
      a third semiconductor channel layer, wherein the second semiconductor channel layer is connected to a source region of the third semiconductor channel layer, and wherein the first semiconductor channel layer, the second semiconductor channel layer and the third semiconductor channel layer are connected in sequence, and the first semiconductor channel layer, the second semiconductor channel layer and the third semiconductor channel layer belong to the same layer;
      a third gate, overlapped with the third semiconductor channel layer and electrically connected to the third scan line; and
      a third drain, electrically connected to the third semiconductor channel layer; and
   a third pixel electrode, electrically connected to the third drain.

3. The active device substrate of claim 1, further comprising:
   a capacitor electrode, overlapped with the first semiconductor channel layer.

4. The active device substrate of claim 3, wherein the first drain is overlapped with the capacitor electrode.

5. The active device substrate of claim 3, wherein an extending direction of the capacitor electrode, an extending direction of the first scan line and an extending direction of the second scan line are substantially the same.

6. The active device substrate of claim 1, wherein a material of the first island structure and the second island structure comprises a cured photosensitive material.

7. The active device substrate of claim 1, wherein a vertical projection area of the first island structure on the substrate is substantially the same as a vertical projection area of the first drain on the substrate.

8. The active device substrate of claim 1, further comprising:
   a first common electrode, located on the first insulating layer;
   a second common electrode, located on the first insulating layer; and
   a second insulating layer, located on the first common electrode, the second common electrode and the first insulating layer, wherein the first pixel electrode and the second pixel electrode are located on the second insulating layer, and the first opening and the second opening penetrate through the second insulating layer.

9. The active device substrate of claim 1, wherein the first active device and the second active device are located between the first scan line and the second scan line.

10. The active device substrate of claim 1, wherein the first gate comprises:
    a first extending part, connected to the first scan line; and
    a first branch part, connected to the first extending part and having an included angle with the first extending part, wherein the first extending part and the first branch part are respectively overlapped with the first semiconductor channel layer.

11. The active device substrate of claim 2, wherein the first scan line comprises a first conductive line and a second conductive line parallel to each other, the first gate comprises a first part and a second part separated from each other, and the first part and the second part are electrically connected to the first conductive line and the second conductive line, respectively.

12. An active device substrate, comprising:
a substrate;
a first scan line, a second scan line and a data line, disposed on the substrate;
a first active device, comprising:
   a first semiconductor channel layer;
   a first gate, overlapped with the first semiconductor channel layer and electrically connected to the first scan line;
   a first source, electrically connected to the data line and the first semiconductor channel layer; and
   a first drain, electrically connected to the first semiconductor channel layer;
a first pixel electrode, electrically connected to the first drain;
a first island structure, located on the first drain;
a second active device, comprising:
   a second semiconductor channel layer, wherein the first semiconductor channel layer is connected to a source region of the second semiconductor channel layer, and the first semiconductor channel layer and the second semiconductor channel layer belong to a same layer;
   a second gate, overlapped with the second semiconductor channel layer and electrically connected to the second scan line, wherein the first gate and the second gate are completely located between the first scan line and the second scan line; and
   a second drain, electrically connected to the second semiconductor channel layer; and
a second pixel electrode, electrically connected to the second drain;
a second island structure, located on the second drain; and
a first insulating layer, covering the first island structure, the second island structure and the data line, wherein the first pixel electrode is electrically connected to the first drain through a first opening, the second pixel electrode is electrically connected to the second drain through a second opening, the first opening penetrates through the first island structure and the first insulating layer, and the second opening penetrates through the second island structure and the first insulating layer.

13. The active device substrate of claim 12, further comprising:
a capacitor electrode, overlapped with the first semiconductor channel layer.

14. The active device substrate of claim 13, wherein the first drain is overlapped with the capacitor electrode.

15. The active device substrate of claim 13, wherein an extending direction of the capacitor electrode, an extending direction of the first scan line and an extending direction of the second scan line are substantially the same.

16. The active device substrate of claim 12, wherein a vertical projection area of the first island structure on the substrate is substantially the same as a vertical projection area of the first drain on the substrate.

17. The active device substrate of claim 12, further comprising:
a first common electrode, located on the first insulating layer;
a second common electrode, located on the first insulating layer; and
a second insulating layer, located on the first common electrode, the second common electrode and the first insulating layer, wherein the first pixel electrode and the second pixel electrode are located on the second insulating layer, and the first opening and the second opening penetrate through the second insulating layer.

18. The active device substrate of claim 12, wherein the first active device and the second active device are located between the first scan line and the second scan line.

19. The active device substrate of claim 12, wherein the first gate comprises:
a first extending part, connected to the first scan line; and
a first branch part, connected to the first extending part and having an included angle with the first extending part, wherein the first extending part and the first branch part are respectively overlapped with the first semiconductor channel layer.

* * * * *